(12) United States Patent
Lee et al.

(10) Patent No.: US 10,021,784 B1
(45) Date of Patent: Jul. 10, 2018

(54) ELECTRONIC DEVICE AND ELECTRONIC CIRCUIT BOARD THEREOF

(71) Applicant: POWERTECH TECHNOLOGY INC., Hsinchu County (TW)

(72) Inventors: Ping-Che Lee, Hsinchu County (TW); Ying-Tang Chao, Hsinchu County (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 15/846,443

(22) Filed: Dec. 19, 2017

(51) Int. Cl.
H05K 1/11 (2006.01)
H05K 1/14 (2006.01)
H05K 1/09 (2006.01)

(52) U.S. Cl.
CPC ............ *H05K 1/112* (2013.01); *H05K 1/09* (2013.01); *H05K 2201/09218* (2013.01); *H05K 2201/09381* (2013.01); *H05K 2201/09409* (2013.01); *H05K 2201/10734* (2013.01)

(58) Field of Classification Search
CPC . H05K 1/09; H05K 1/11; H05K 1/111; H05K 1/112; H05K 2201/09409; H05K 2201/09336; H05K 2201/09636; H05K 2201/09618; H05K 2201/09609; H05K 2201/09709; H01R 23/688; H01R 12/515; H01L 23/49816; H01L 23/49838; H01L 23/5286; G06F 17/5077
See application file for complete search history.

(56) References Cited

U.S. PATENT DOCUMENTS

| 6,608,379 B2* | 8/2003 | Yeo | H01L 23/3677 438/122 |
| 7,034,391 B2* | 4/2006 | Pendse | H01L 23/49838 361/735 |
| 7,709,747 B2* | 5/2010 | Morlion | H05K 1/114 174/262 |
| 2006/0227522 A1* | 10/2006 | Huang | H01L 23/645 361/782 |
| 2015/0114706 A1* | 4/2015 | Rose | H05K 1/0245 174/262 |
| 2016/0037644 A1* | 2/2016 | Nakagawa | H05K 1/111 361/767 |
| 2016/0309576 A1* | 10/2016 | Sharav | H05K 1/0213 |

\* cited by examiner

*Primary Examiner* — Chau N Nguyen
*Assistant Examiner* — Roshn Varghese
(74) *Attorney, Agent, or Firm* — Rosenberg, Klein & Lee

(57) ABSTRACT

An electronic device and an electronic circuit board thereof is disclosed. In the electronic circuit board an insulation substrate is provided with conductive pads, first conductive vias, second conductive vias, third conductive vias, first conductive traces, second conductive traces, and third conductive traces. The conductive pads are arranged in two rows. Each row includes biasing pads and signal pads. The second conductive vias and the third conductive vias are respectively arranged inside and outside the first conductive vias. Each of the signal pads arranged in a row nearest the second conductive vias electrically connects with one second conductive via through a first conductive trace. Each of the signal pads arranged in a row nearest the third conductive vias electrically connects with one third conductive via through a second conductive trace. The third conductive traces embedded in the insulation substrate are extended to positions vertically under the signal pads.

20 Claims, 7 Drawing Sheets

ELECTRONIC DEVICE AND ELECTRONIC CIRCUIT BOARD THEREOF

BACKGROUND OF THE INVENTION

Field of the Invention

The present invention relates to electronic technology, and more particularly to an electronic device and an electronic circuit board thereof.

Description of the Related Art

Due to the trend of increased densities in packaging semiconductor chips fine ball grid array (FBGA) packages have been developed which permit the reduction of the semiconductor packaging profile as well as providing increased package density. Typically, the FBGA packages include a semiconductor die attached to a lead frame mounted on the top surface of a printed circuit board (PCB). The semiconductor die is formed with a plurality of bond pads which are electrically connected with the lead frame. Further, wire bonds are used to form the connection between the plurality of bond pads on the semiconductor die and terminal pads on the lead frame. Conductive elements, such as solder balls, are bonded to conductive traces of the PCB. The semiconductor die, lead frame and wire bonds are encapsulated with a molding compound.

The BGA and other high density array packages are used by PCB manufacturers to reduce board space required for a particular product. To reduce board space, PCB manufacturers have used ever-smaller pitch ball spacing, i.e., spacing between ball rows and ball columns. To use these ever-smaller pitches, PCB manufacturers have been required to use expensive techniques to fabricate a PCB. BGA pads 10 on a PCB 12 of conventional technology are shown in FIG. 1. In FIG. 1 and FIG. 2, a spacing D1 between centers of two neighboring BGA pads 10 is about 0.4 mm The PCB 12 has conductive traces 14 and conductive vias 16 therein, wherein the conductive vias 16 penetrate through the PCB 12 and are respectively arranged vertically under the BGA pads 10. The conductive vias 16 and the BGA pads 10 have the same positions. The width of the conductive trace 14 arranged between the two conductive vias 16 is thinner. The width of the conductive trace 14 not arranged between the two conductive vias 16 is thicker. In other words, the width of the conductive trace 14 of the PCB 12 changes according to its position, so that there is a mismatch in the impedance of the conductive trace 14.

To overcome the abovementioned problems, the present invention provides an electronic device and an electronic circuit board thereof, so as to solve the deficiencies of the prior art.

SUMMARY OF THE INVENTION

A primary objective of the present invention is to provide an electronic device and an electronic circuit board thereof, which changes the positions of conductive vias corresponding to signal pads to increase a distance between two neighboring conductive vias. In this way, the width of conductive traces embedded in an insulation substrate is fixed, so as to match the impedance of the conductive traces and reduce the limit to fabrication abilities of PCB manufacturers and reduce the fabrication cost of PCBs.

To achieve the abovementioned objectives, the present invention provides an electronic circuit board, which comprises an insulation substrate, a plurality of conductive pads, a plurality of first conductive vias, a plurality of second conductive vias, a plurality of third conductive vias, a plurality of first conductive traces, a plurality of second conductive traces, and a plurality of third conductive traces. The insulation substrate has at least one first region, a second region, and a third region. The first region has a plurality of first through holes. The second region has a plurality of second through holes. The third region has a plurality of third through holes. The first region surrounds the third region and the second region surrounds the first region. The conductive pads are arranged on the first region in at least two rows. Each row comprises a plurality of biasing pads and a plurality of signal pads. At least one of the plurality of biasing pads is arranged between two of the plurality of signal pads. The first conductive vias are correspondingly formed in the plurality of first through holes of the insulation substrate and correspondingly electrically connected to the plurality of biasing pads of the plurality of conductive pads. The second conductive vias are correspondingly formed in the plurality of second through holes of the insulation substrate. Each of the plurality of signal pads arranged in a row nearest the second region is correspondingly electrically connected to one of the plurality of second conductive vias through a first conductive trace on the first region. The third conductive vias are correspondingly formed in the plurality of third through holes of the insulation substrate. Each of the plurality of signal pads arranged in a row nearest the third region is correspondingly electrically connected to one of the plurality of third conductive vias through a second conductive trace on the first region. The third conductive traces are embedded in the insulation substrate and extended to positions vertically under the signal pads.

In an embodiment of the present invention the first conductive trace and the second conductive trace are straight conductive traces. And, the lengths of the first conductive trace and the second conductive trace depend on the width of the third conductive trace and the distance between centers of the signal pad and the biasing pad neighboring thereto.

In an embodiment of the present invention the plurality of conductive pads are electrically connected and physically attached to conductive balls of a ball grid array (BGA) package.

In an embodiment of the present invention the BGA package is a fine pitch ball grid array (FBGA) package, a very fine pitch ball grid array (VFBGA) package, a micro ball grid array (μBGA) package, or a window ball grid array (WBGA) package.

In an embodiment of the present invention the insulation substrate comprises polyimide, and the first conductive trace, the second conductive trace, the plurality of third conductive traces, the plurality of conductive pads, the plurality of first conductive vias, the plurality of second conductive vias, and the plurality of third conductive vias comprise copper or aluminum.

In an embodiment of the present invention the plurality of conductive pads are arranged to form four rows.

In an embodiment of the present invention the conductive pad has a circular shape or a polygon shape.

In an embodiment of the present invention there are four first regions.

In an embodiment of the present invention the biasing pads are ground pads or power pads.

In an embodiment of the present invention the width of each of the plurality of third conductive traces is constant.

The present invention also provides an electronic device, which comprises an electronic circuit board and a ball grid array (BGA) package. The electronic circuit board comprises an insulation substrate, a plurality of conductive pads, a plurality of first conductive vias, a plurality of second conductive vias, a plurality of third conductive vias, a plurality of first conductive traces, a plurality of second conductive traces, and a plurality of third conductive traces. The insulation substrate has at least one first region, a second region, and a third region. The first region has a plurality of first through holes. The second region has a plurality of second through holes. The third region has a plurality of third through holes. The first region surrounds the third region and the second region surrounds the first region. The conductive pads are arranged on the first region in at least two rows. Each row comprises a plurality of biasing pads and a plurality of signal pads. At least one of the plurality of biasing pads is arranged between two of the plurality of signal pads. The first conductive vias are correspondingly formed in the plurality of first through holes of the insulation substrate and correspondingly electrically connected to the plurality of biasing pads of the plurality of conductive pads. The second conductive vias are correspondingly formed in the plurality of second through holes of the insulation substrate. Each of the plurality of signal pads arranged in a row nearest the second region is correspondingly electrically connected to one of the plurality of second conductive vias through a first conductive trace on the first region. The third conductive vias are correspondingly formed in the plurality of third through holes of the insulation substrate. Each of the plurality of signal pads arranged in a row nearest the third region is correspondingly electrically connected to one of the plurality of third conductive vias through a second conductive trace on the first region. The third conductive traces are embedded in the insulation substrate and extended to positions vertically under the signal pads. The plurality of conductive pads are electrically connected and physically attached to conductive balls of the BGA package.

In an embodiment of the present invention the first conductive trace and the second conductive trace are straight conductive traces. And, the lengths of the first conductive trace and the second conductive trace depend on the width of the third conductive trace and the distance between centers of the signal pad and the biasing pad neighboring thereto.

In an embodiment of the present invention the BGA package is a fine pitch ball grid array (FBGA) package, a very fine pitch ball grid array (VFBGA) package, a micro ball grid array (μBGA) package, or a window ball grid array (WBGA) package.

In an embodiment of the present invention the insulation substrate comprises polyimide, and the first conductive trace, the second conductive trace, the plurality of third conductive traces, the plurality of conductive pads, the plurality of first conductive vias, the plurality of second conductive vias, and the plurality of third conductive vias comprise copper or aluminum.

In an embodiment of the present invention the plurality of conductive pads are arranged to form four rows.

In an embodiment of the present invention the conductive pad has a circular shape or a polygon shape.

In an embodiment of the present invention the width of each of the plurality of third conductive traces is constant.

In an embodiment of the present invention the biasing pads are ground pads or power pads.

Below, the embodiments are described in detail in cooperation with the drawings to make easily understood the technical contents, characteristics and accomplishments of the present invention.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
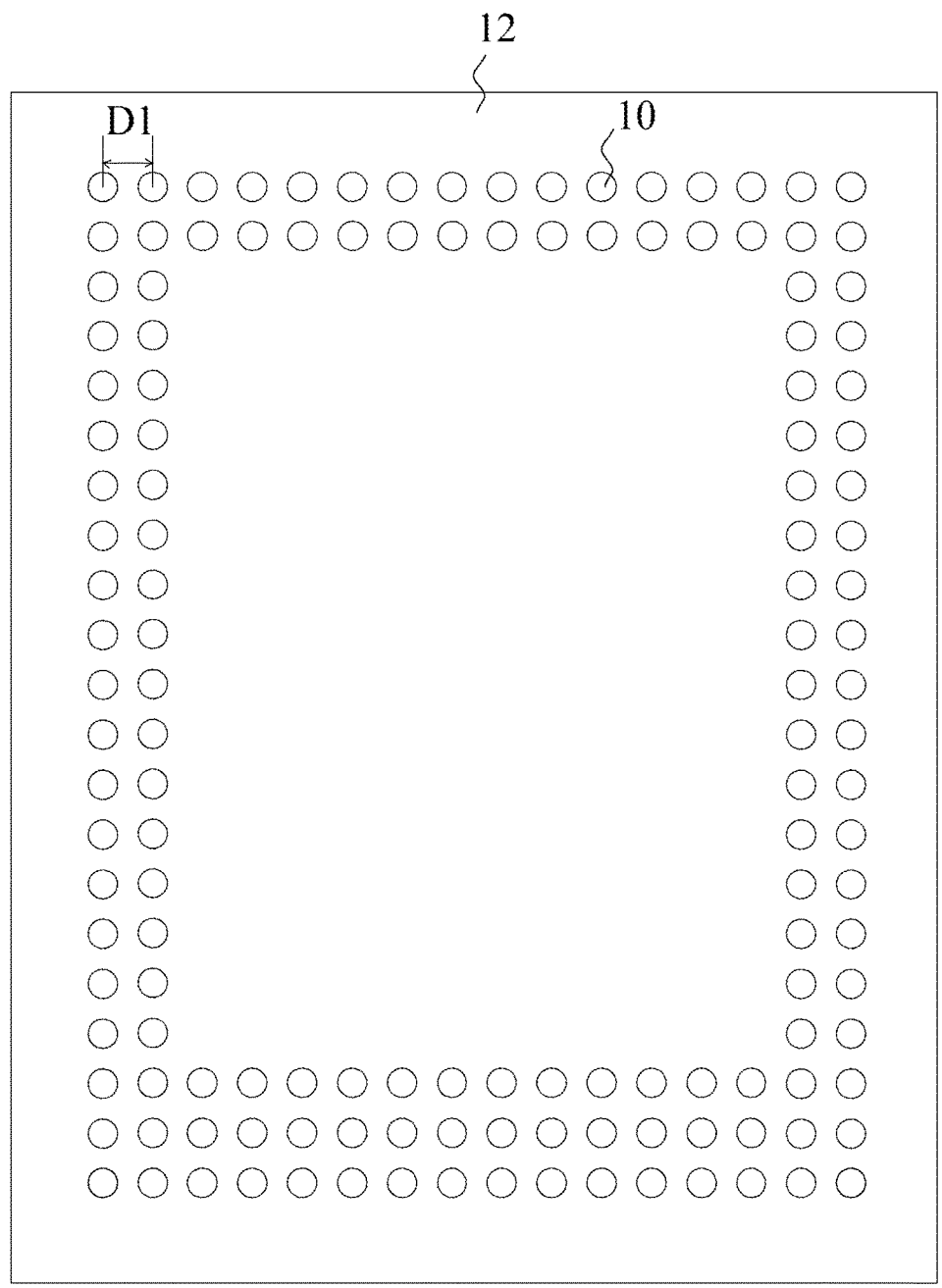
FIG. 1 is a top view of a printed circuit board (PCB) and ball grid array (BGA) pads thereon of the prior art.
Figure 2:
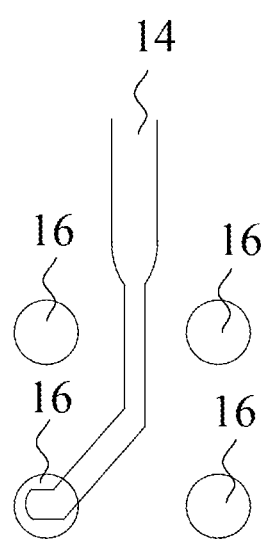
FIG. 2 is a diagram schematically showing conductive vias and a conductive trace of the prior art.
Figure 3:
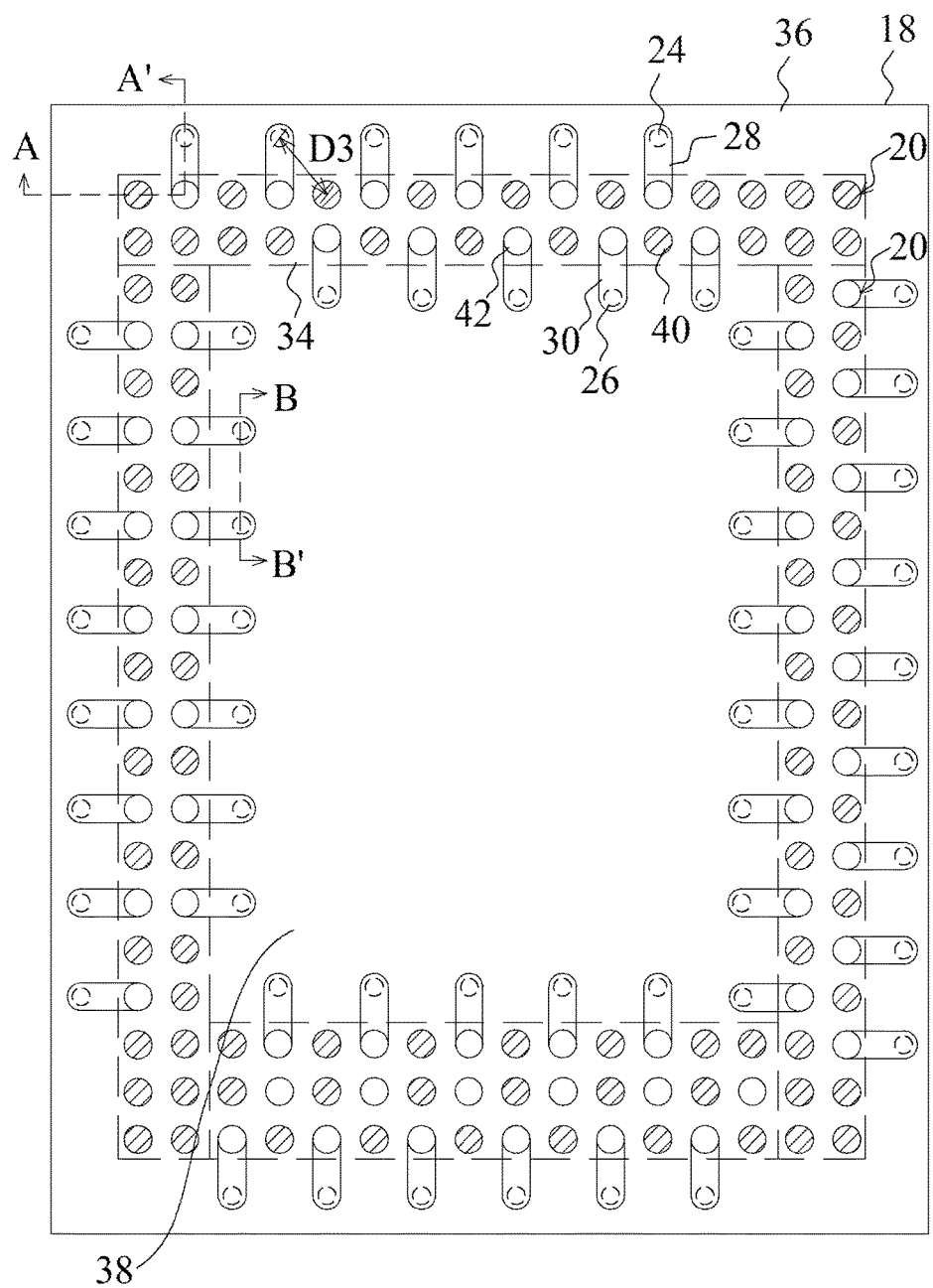
FIG. 3 is a top view of an electronic circuit board according to an embodiment of the present invention.
Figure 4:
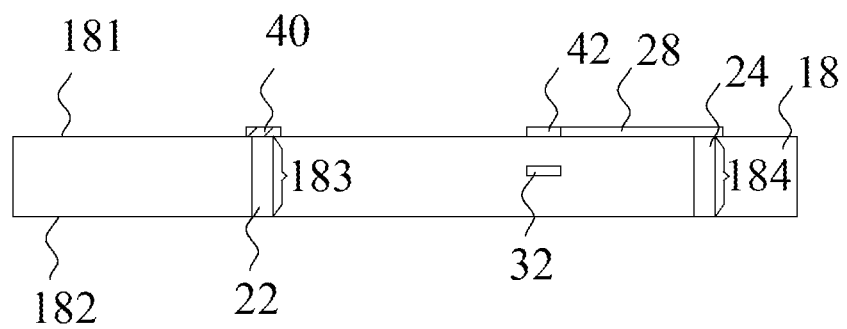
FIG. 4 is a sectional view taken along Line A-A' of FIG. 3.
Figure 5:
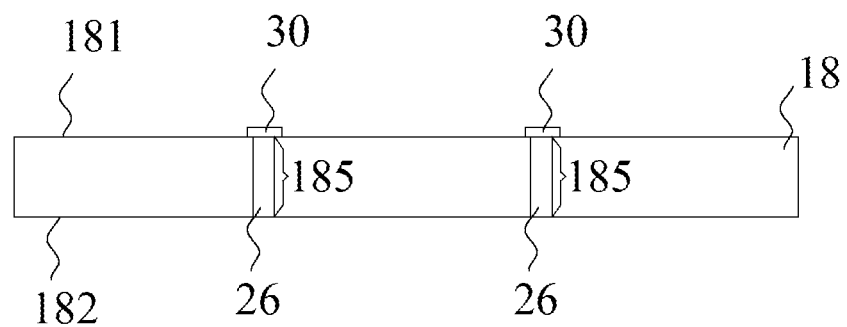
FIG. 5 is a sectional view taken along Line B-B' of FIG. 3.

Refer to FIG. 3, FIG. 4, FIG. 5, and FIG. 6. FIG. 4 is a sectional view taken along Line A-A' of FIG. 3. FIG. 5 is a sectional view taken along Line B-B' of FIG. 3. Thus, the whole structure of the electronic circuit board is illustrated according to FIG. 3, FIG. 4, FIG. 5, and FIG. 6. The electronic circuit board comprises an insulation substrate 18, a plurality of conductive pads 20, a plurality of first conductive vias 22, a plurality of second conductive vias 24, a plurality of third conductive vias 26, a plurality of first conductive traces 28, a plurality of second conductive traces 30, and a plurality of third conductive traces 32. The first conductive via 22, the second conductive via 24, and the third conductive via 26 each have a shape of cylinder. The cylinder has a cross-sectional radius r. The conductive pad 20 may have a circular shape or a polygon shape. In the exemplary embodiment, the conductive pad 20 has a circular shape. The insulation substrate 18 comprises polyimide. The first conductive trace 28, the second conductive trace 30, the third conductive traces 32, the conductive pads 20, the first conductive vias 22, the second conductive vias 24, and the third conductive vias 26 may comprise copper or aluminum. The insulation substrate 18 has a first surface 181 and a second surface 182 opposite the first surface 181. The first conductive trace 28 and the second conductive trace 30 are arranged on the first surface 181 of the insulation substrate 18. The insulation substrate 18 has at least one first region 34, a second region 36, and a third region 38. The first region 34 has a plurality of first through holes 183. The second region 36 has a plurality of second through holes 184. The third region 38 has a plurality of third through holes 185. The first region 34 surrounds the third region 38. The second region 36 surrounds the first region 34. In the exemplary embodiment shown in FIG. 3, there are four first regions 34. The conductive pads 20 are arranged on the first surface 181 of the insulation substrate 18. The conductive pads 20 are arranged on the first region 34. The conductive pads 20 may be arranged in at least two rows. Each row comprises a plurality of biasing pads 40 and a plurality of signal pads 42. The plurality of biasing pads 40 and the plurality of signal pads 42 are arranged on the first surface 181 of the insulation substrate 18. One first region 34 may be provided with three rows of conductive pads 20. Each of the remaining first regions 34 may be provided with two rows of conductive pads 20. The conductive pads 20 may be arranged to form four rows or less. The biasing pads 40 may be ground pads or power pads. At least one biasing pad 40 is arranged between two neighboring signal pads 42. The first conductive vias 22 are arranged in the first region 34. The first conductive vias 22 are correspondingly formed in the plurality of first through holes 183 of the insulation substrate 18 and correspondingly electrically connected to the plurality of biasing pads 40 of the plurality of conductive pads 20. The second conductive vias 24 are arranged in the second region 36. The second conductive vias 24 are correspondingly formed in the plurality of second through holes 184 of the insulation substrate 18. Each of the signal pads 42 arranged in a row nearest the second region 36 is correspondingly electrically connected to one of the plurality of second conductive vias 24 through a first conductive trace 28. The first conductive trace 28 may be a conductive trace formed on the first region 34 and extends towards the second region 36. The first conductive trace 28 may be straight conductive trace. The third conductive vias 26 are arranged in the third region 38. The third conductive vias 26 are correspondingly formed in the plurality of third through holes 185 of the insulation substrate 18. Each of the signal pads 42 arranged in a row nearest the third region 38 is correspondingly electrically connected to one of the plurality of third conductive vias 26 through a second conductive trace 30. The second conductive trace 30 may be a conductive trace formed on the first region 34 and extends to the third region 38. The second conductive trace 30 may be straight conductive trace. The third conductive traces 32 are embedded between the first surface 181 and the second surface 182 of the insulation substrate 18. The third conductive traces 32 are extended to positions vertically under the signal pads 42.

Figure 6:
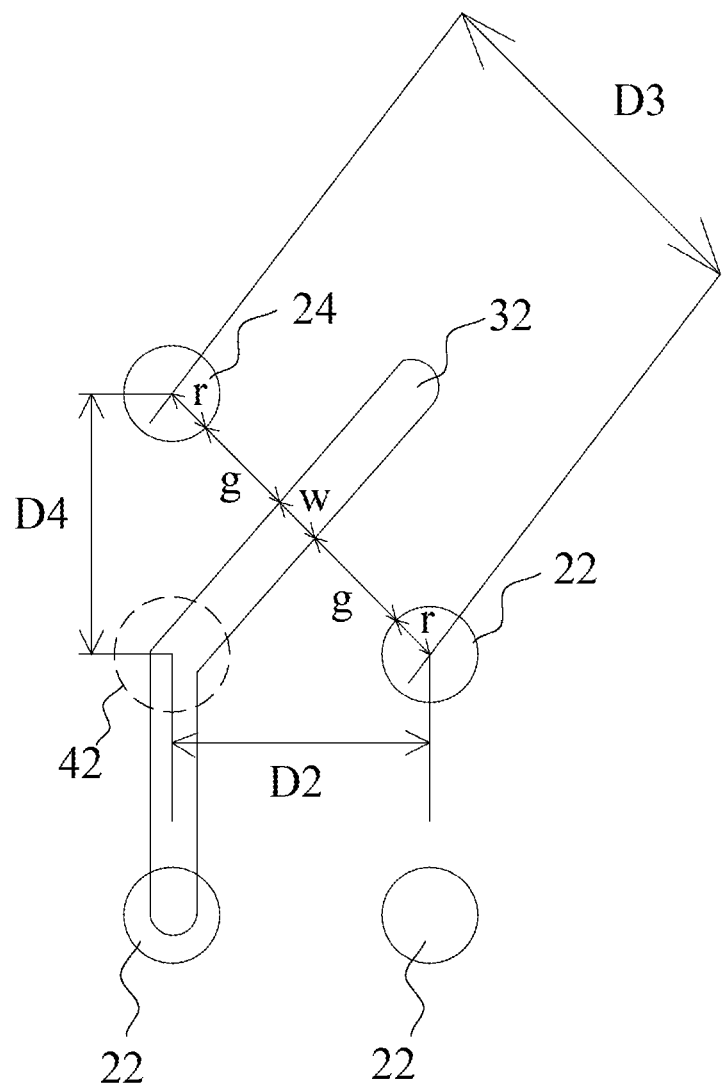
FIG. 6 is a diagram schematically showing first conductive vias and a third conductive via according to an embodiment of the present invention.

As shown in FIG. 3 and FIG. 6, the signal pad 42 is illustrated as a dash circle. The lengths of the first conductive trace 28 and the second conductive trace 30 depend on the width w of the third conductive trace 32 and the distance D2 between the centers of the signal pad 42 and the neighboring biasing pad 40 neighboring thereto. The center of the biasing pad 40 and the center of the first conductive via 22 are aligned to each other. The minimum spacing between the third conductive trace 32 and the first conductive via 22 is g. The minimum spacing between the third conductive trace 32 and the second conductive via 24 is g. A distance between the centers of the first conductive via 22 and the second conductive via 24 is represented as distance D3. The distance D3 may be calculated according to following equation: D3=w+2g+2r, and D3>D2. As a result, a distance between the centers of the second conductive via 24 and the signal pad 42 is represented as distance D4. Since the distances D2, D3, and D4 form a right triangle, D4 is obtained according to D2, D3, and the Pythagorean theorem. When D4 is longer, the length of the first conductive trace 28 is longer. In this way, no matter where the third conductive traces 32 pass, the width of each of the plurality of third conductive traces 32 is constant. Similarly, the length of the second conductive trace 30 is also calculated. The present invention changes positions of conductive vias corresponding to the signal pads 42 to increase a distance between two neighboring conductive vias. As a result, the width of the third conductive traces 32 embedded in the insulation substrate 18 is fixed to match the impedance of the third conductive traces 32 and reduce the limit to fabrication abilities of PCB manufacturers and reduce the fabrication cost of PCBs.

Figure 7:
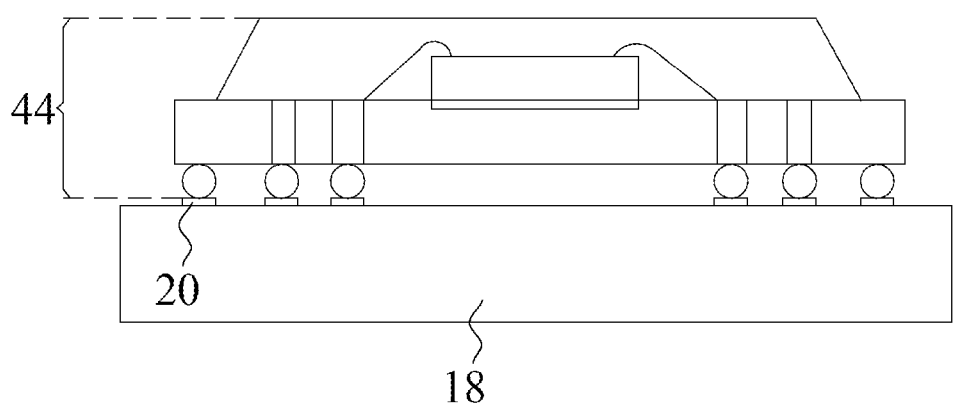
FIG. 7 is a diagram schematically showing an electronic device according to an embodiment of the present invention.

Refer to FIG. 3 and FIG. 7. The electronic device of the present invention comprises the abovementioned electronic circuit board and a ball grid array (BGA) package 44, such as a fine pitch ball grid array (FBGA) package, a very fine pitch ball grid array (VFBGA) package, a micro ball grid array (μBGA) package, or a window ball grid array (WBGA) package, but the present invention is not limited thereto. The plurality of conductive pads 20 are electrically connected and physically attached to conductive balls of the BGA package 44.

In conclusion, the present invention fabricates the electronic circuit board without changing the width of the third conductive traces, and reduces the fabrication cost of the electronic circuit board applied to the BGA package.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:
1. An electronic circuit board comprising:
an insulation substrate having at least one first region, a second region, and a third region, the at least one first region has a plurality of first through holes, the second region has a plurality of second through holes, the third region has a plurality of third through holes, the at least one first region surrounds the third region, the second region surrounds the at least one first region;
a plurality of conductive pads arranged on the at least one first region in at least two rows, each of the at least two rows comprises a plurality of biasing pads and a plurality of signal pads, at least one of the plurality of biasing pads is arranged between two of the plurality of signal pads;
a plurality of first conductive vias correspondingly formed in the plurality of first through holes of the insulation substrate, and correspondingly electrically connected to the plurality of biasing pads of the plurality of conductive pads;
a plurality of second conductive vias correspondingly formed in the plurality of second through holes of the insulation substrate, each of the plurality of signal pads arranged in a row nearest the second region is correspondingly electrically connected to one of the plurality of second conductive vias through a first conductive trace on the at least one first region;
a plurality of third conductive vias correspondingly formed in the plurality of third through holes of the insulation substrate, each of the plurality of signal pads arranged in a row nearest the third region is correspondingly electrically connected to one of the plurality of third conductive vias through a second conductive trace on the at least one first region; and a plurality of third conductive traces embedded in the insulation substrate and extended to positions vertically under the signal pads.

2. The electronic circuit board according to claim 1, wherein the first conductive trace and the second conductive trace are straight conductive traces, and lengths of the first conductive trace and the second conductive trace depend on a width of the third conductive trace and a distance between centers of the signal pad and the biasing pad neighboring thereto.

3. The electronic circuit board according to claim 1, wherein the plurality of conductive pads are electrically connected and physically attached to conductive balls of a ball grid array (BGA) package.

4. The electronic circuit board according to claim 3, wherein the BGA package is a fine pitch ball grid array (FBGA) package, a very fine pitch ball grid array (VFBGA) package, a micro ball grid array (μBGA) package, or a window ball grid array (WBGA) package.

5. The electronic circuit board according to claim 1, wherein the insulation substrate comprises polyimide.

6. The electronic circuit board according to claim 1, wherein the first conductive trace, the second conductive trace, and the plurality of third conductive traces comprise copper or aluminum.

7. The electronic circuit board according to claim 1, wherein the plurality of conductive pads comprise copper or aluminum.

8. The electronic circuit board according to claim 1, wherein the plurality of first conductive vias, the plurality of second conductive vias, and the plurality of third conductive vias comprise copper or aluminum.

9. The electronic circuit board according to claim 1, wherein the plurality of conductive pads are arranged to form four rows.

10. The electronic circuit board according to claim 1, wherein the conductive pad has a circular shape or a polygon shape.

11. The electronic circuit board according to claim 1, wherein the at least one first region further comprises four first regions.

12. The electronic circuit board according to claim 1, wherein the biasing pads are ground pads or power pads.

13. The electronic circuit board according to claim 1, wherein a width of each of the plurality of third conductive traces is constant.

14. An electronic device comprising:
an electronic circuit board comprising:
an insulation substrate having at least one first region, a second region, and a third region, the at least one first region has a plurality of first through holes, the second region has a plurality of second through holes, the third region has a plurality of third through holes, the at least one first region surrounds the third region, the second region surrounds the at least one first region;
a plurality of conductive pads arranged on the at least one first region in at least two rows, each of the at least two rows comprises a plurality of biasing pads and a plurality of signal pads, at least one of the plurality of biasing pads is arranged between two of the plurality of signal pads;

a plurality of first conductive vias correspondingly formed in the plurality of first through holes of the insulation substrate, and correspondingly electrically connected to the plurality of biasing pads of the plurality of conductive pads;

a plurality of second conductive vias correspondingly formed in the plurality of second through holes of the insulation substrate, each of the plurality of signal pads arranged in a row nearest the second region is correspondingly electrically connected to one of the plurality of second conductive vias through a first conductive trace on the at least one first region;

a plurality of third conductive vias correspondingly formed in the plurality of third through holes of the insulation substrate, each of the plurality of signal pads arranged in a row nearest the third region is correspondingly electrically connected to one of the plurality of third conductive vias through a second conductive trace on the at least one first region; and a plurality of third conductive traces embedded in the insulation substrate and extended to positions arranged vertically under the signal pads; and a ball grid array (BGA) package with conductive balls thereof electrically connected and physically attached to the plurality of conductive pads.

15. The electronic device according to claim 14, wherein the first conductive trace and the second conductive trace are straight conductive traces, and lengths of the first conductive trace and the second conductive trace depend on a width of the third conductive trace and a distance between centers of the signal pad and the biasing pad neighboring thereto.

16. The electronic device according to claim 14, wherein the BGA package is a fine pitch ball grid array (FBGA) package, a very fine pitch ball grid array (VFBGA) package, a micro ball grid array (μBGA) package, or a window ball grid array (WBGA) package.

17. The electronic device according to claim 14, wherein the insulation substrate comprises polyimide, and the first conductive trace, the second conductive trace, the plurality of third conductive traces, the plurality of conductive pads, the plurality of first conductive vias, the plurality of second conductive vias, and the plurality of third conductive vias comprise copper or aluminum.

18. The electronic device according to claim 14, wherein the conductive pad has a circular shape or a polygon shape.

19. The electronic device according to claim 14, wherein a width of each of the plurality of third conductive traces is constant.

20. The electronic device according to claim 14, wherein the biasing pads are ground pads or power pads.

* * * * *